United States Patent
Yamaguchi

(10) Patent No.: US 7,484,035 B2
(45) Date of Patent: Jan. 27, 2009

(54) MICROCOMPUTER WITH BUILT-IN FLASH MEMORY

(75) Inventor: Masaya Yamaguchi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 204 days.

(21) Appl. No.: 11/110,868

(22) Filed: Apr. 21, 2005

(65) Prior Publication Data

US 2005/0240720 A1    Oct. 27, 2005

(30) Foreign Application Priority Data

Apr. 22, 2004    (JP)    ............... 2004-126343

(51) Int. Cl.
*G06F 13/00* (2006.01)
*G06F 12/00* (2006.01)

(52) U.S. Cl. ...................... 711/103; 711/167

(58) Field of Classification Search ............. 711/103
See application file for complete search history.

(56) References Cited

U.S. PATENT DOCUMENTS 5,550,489 A * 8/1996 Raab .................... 326/93
5,923,838 A * 7/1999 Hongo .................. 714/42

FOREIGN PATENT DOCUMENTS

JP    2002-183109    6/2002

OTHER PUBLICATIONS

Caywood et al, "A Novel Nonvolatile Memory Cell Suitable for Both Flash and Byte-Writable Applications", IEEE Transactions on Electron Devices, vol. 45, No. 5, May 2002.*

* cited by examiner

*Primary Examiner*—Reginald G. Bragdon
*Assistant Examiner*—Eric Loonan
(74) *Attorney, Agent, or Firm*—McGinn IP Law Group, PLLC

(57) ABSTRACT

A microcomputer with built-in flash memory to which data can be written using a write clock signal, comprises a fixed oscillator circuit which outputs a clock signal of fixed frequency for generating the write clock signal. The flash memory is designed with a write-disturb time such that data loss does not occur when writing data with the write clock signal of fixed frequency.

11 Claims, 9 Drawing Sheets

RELATED ART

MICROCOMPUTER WITH BUILT-IN FLASH MEMORY

BACKGROUND OF THE INVENTION

1. Field of the Invention

The present invention relates to a microcomputer with built-in flash memory, and more particularly to restriction of excessive voltage applied to the memory with errors in write-disturb time when writing data to the flash memory, and to improvements in the data write device so that data loss due to this excessive voltage does not readily occur.

2. Description of the Related Art

Data loss when writing data to the flash memory is a problem in microcomputers with built-in flash memories. FIG. 7A is a partial circuit diagram of a flash memory in which a non-volatile memory cell M of MOS structure is disposed within a matrix, and each gate (control gate) of the plurality of memory cells in the row direction is connected in common to the same word line W, and each drain of the plurality of memory cells M in the column direction is connected in common to the same bit line B. Furthermore, two adjacent memory cells M in the column direction form a pair of memory cells in which each source is connected, and the plurality of pairs of memory cells in the row direction are connected in common to the same source line S.

In this flash memory 100, when data is written to the selected memory cell Ms enclosed within the chain line in the figure, the prescribed voltages are applied to the word line W and the bit line B connected to the selected memory cell Ms, for example, 2V is applied to the word line, and 0.5V is applied to the bit line, and furthermore, the prescribed voltage is applied to the source line S connected to the selected memory cell Ms, so that, for example, data can be written to the memory cell Ms by applying 8V.

FIG. 9 is a partial block circuit diagram of the microcomputer 1A including the data-write device permitting data to be written to the flash memory 100 in this microcomputer. The microcomputer 1A is comprised of a flash memory 100, a main oscillator circuit 120, a CPU 110, and a clock generator circuit 160. The main oscillator circuit 120 employs a crystal oscillator and the like as the oscillation source, and outputs a clock signal. The CPU 110 operates with the clock signal output from the main oscillator circuit 120. The write clock generator circuit 160 generates a write clock signal for writing data to the flash memory 100 with the CPU clock signal generated by the CPU 110. The main oscillator circuit 120 may be external, and the microcomputer user is able to connect an external main oscillator circuit 120 of the desired frequency to the microcomputer 1 so that the CPU 110 operates with a clock signal of the relevant oscillating frequency.

In this data-write device, the CPU 110 operates with the clock signal from the main oscillator circuit 120, and starts the microcomputer 1A. Furthermore, when writing data to the flash memory 100 after the microcomputer 1A is started, similarly, the CPU clock is generated and output by the CPU 110 based on the main oscillator circuit 120 clock signal, and the write clock signal for writing data with this CPU clock signal is generated by the write clock generator circuit 160. The generated write clock signal and the address and data signals are input to the flash memory 100, and data is written to the memory cell selected with the address signal.

FIG. 8 is a diagram showing the timing with which data is written to the flash memory 100 with the generated write clock signal. When the write flag is set, the prescribed voltage is applied to the word line of the memory cell to which selected data is to be written at the rising edge of the write clock signal, and, simultaneously, the prescribed voltage is applied to the source line of the memory cell, and the bit line of the memory cell is set to ON with the data. Thus, current flows from the source line to the bit line in the selected memory cell, and data is written to the memory cell. A plurality of bits of data are normally written to a plurality of memory cells with one write clock in this operation.

The write clock falls prior to selecting the next data, the next write clock rises after the next data is selected, and data is written to another memory cell. The period during which the write clock rises and data is written, and the next write clock then rises and the next data is written, is referred to in a narrow sense as the 'write disturb time'. The time required for one data write cycle when a plurality of write operations with a plurality of write clocks after the write flag is set is assumed as one cycle, is referred to in the wider sense as the 'write disturb time'.

However, when data is written to the selected memory cell Ms in the flash memory 100 shown in FIG. 7A, as shown for the memory cell pair formed from the selected memory cell Ms in FIG. 7B and the memory cell (referred to as the 'adjacent memory cell') Mn, the voltage applied to the selected memory cell Ms is also applied to the source line and bit line connected to the adjacent memory cell Mn. Thus, the aforementioned write-disturb time increases, and when the electric potential of the bit line B decreases with data write, even if the voltage on the word line W of the adjacent memory cell Mn, in other words, the gate voltage, is low, an excessive gate voltage is applied during the write-disturb time, and as a result, the memory cell Mn is set to the ON state, current flows to the adjacent memory cell Mn from the source line S to the bit line B as shown by the dashed line in the same figure, current escapes into the selected Ms via the adjacent memory cell Mn, and data is lost.

This problem of data loss is referred to in Japanese Unexamined Patent Publication No. 2002-183109 (Shinkawa) wherein a technology is proposed in which the load program is executed at high-speed, and overwrite time reduced, by changing to a high-speed CPU run clock supplied from an external source during on-board overwrite in a micro controller with built-in non-volatile memory. Use of a high-speed clock in this manner can reduce write-disturb time, and is effective in preventing data loss.

Shinkawa's technology is effective when a high-speed clock can be supplied from an external source as with on-board overwrite, however this requires an external writer able to output a high-speed clock, and data write with only the internal oscillator circuit of the microcomputer itself is difficult to achieve.

Furthermore, in order to prevent the afore-mentioned data loss, it is desirable that data write be completed before the adjacent memory cell enters the ON state, and that the write-disturb time for the flash memory is set to an appropriate time. Conversely, it is desirable that design is such that the various constants of the flash memory circuit are set to ensure that data loss does not occur even with the prescribed write-disturb time.

However, since the write clock signal in the conventional microcomputer shown in FIG. 9 is generated from a clock signal generated with the main oscillator circuit 120, the frequency of the write clock signal is controlled by the frequency of the main oscillator circuit 120. Thus, when the user connects a high-frequency main oscillator circuit to the microcomputer having the same flash memory, the data loss problem will occur rarely since the write-disturb time is short. However, in cases where a low-cost microcomputer is employed at the user's request, and a low-frequency main oscillator circuit is mounted and thus the microcomputer operates at a low frequency, the write clock signal is also of low-frequency, write-disturb time increases, and data loss readily occurs.

In relation to this problem, consideration of write-disturb time based on the frequency of the main oscillator circuit clock signal mounted in the microcomputer, and design of a flash memory in which data loss does not occur even at this write-disturb time is possible, however this requires design of a flash memory having a write-disturb time differing for each frequency of the main oscillator circuit, and it is difficult to implement a microcomputer having different operating speeds while using a standardized flash memory, and the microcomputer becomes expensive.

SUMMARY OF THE INVENTION

According to one aspect of the present invention, there is provided a microcomputer with built-in flash memory to which data can be written using a write clock signal, the microcomputer comprising a fixed oscillator circuit which outputs a clock signal of fixed frequency for generating the write clock signal, and wherein the flash memory is designed with a write-disturb time such that data loss does not occur when writing data with the write clock signal of fixed frequency.

According to another aspect of the present invention, there is provided a microcomputer with built-in flash memory to which data can be written with a write clock signal, the microcomputer comprising a fixed oscillator circuit which outputs a first clock signal of fixed frequency for generating the write clock signal, a selector for selecting either the first clock signal output from the fixed oscillator circuit or a second clock signal input from an external source, and a control circuit selecting at least the first clock signal with the selector when writing data to the flash memory.

The microcomputer of the present invention is configured in this manner to have an internal fixed oscillator circuit in which the frequency is fixed, and data is written to the flash memory based on the clock signal generated by the fixed oscillator circuit. Simultaneously, by designing appropriately for the write-disturb time when writing with the write clock obtained from the clock signal, data loss occurs less readily in the flash memory writing can be achieved with the fixed-frequency write clock signal when writing data, the excessive voltage due to errors in the write-disturb time can be reduced, and data loss occurs less readily. Thus, when microcomputers of differing operating speeds in which the frequency of the main oscillator circuit differs due to differences between users are incorporated, particularly when building a microcomputer of low oscillation frequency of the main oscillator circuit and low operating speed, data loss can be made to occur less readily in a flash memory as described in the section on Description of the Related Art.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A desirable aspect of the present invention is a fixed oscillator circuit comprised of a ring oscillator circuit. Furthermore, the flash memory has a circuit configuration in which a large number of non-volatile MOS memory cell elements disposed in a matrix, adjacent pairs of memory cells connected by common bit lines and source lines, and the gates of the two memory cells connected by different word lines, wherein either of the memory cells is selected with the word line, and a common voltage is supplied to the common bit lines and word lines to write [data]. Furthermore, it has a write clock generator circuit generating the write clock from the clock signal output by the fixed oscillator circuit.

First Embodiment

Figure 1:
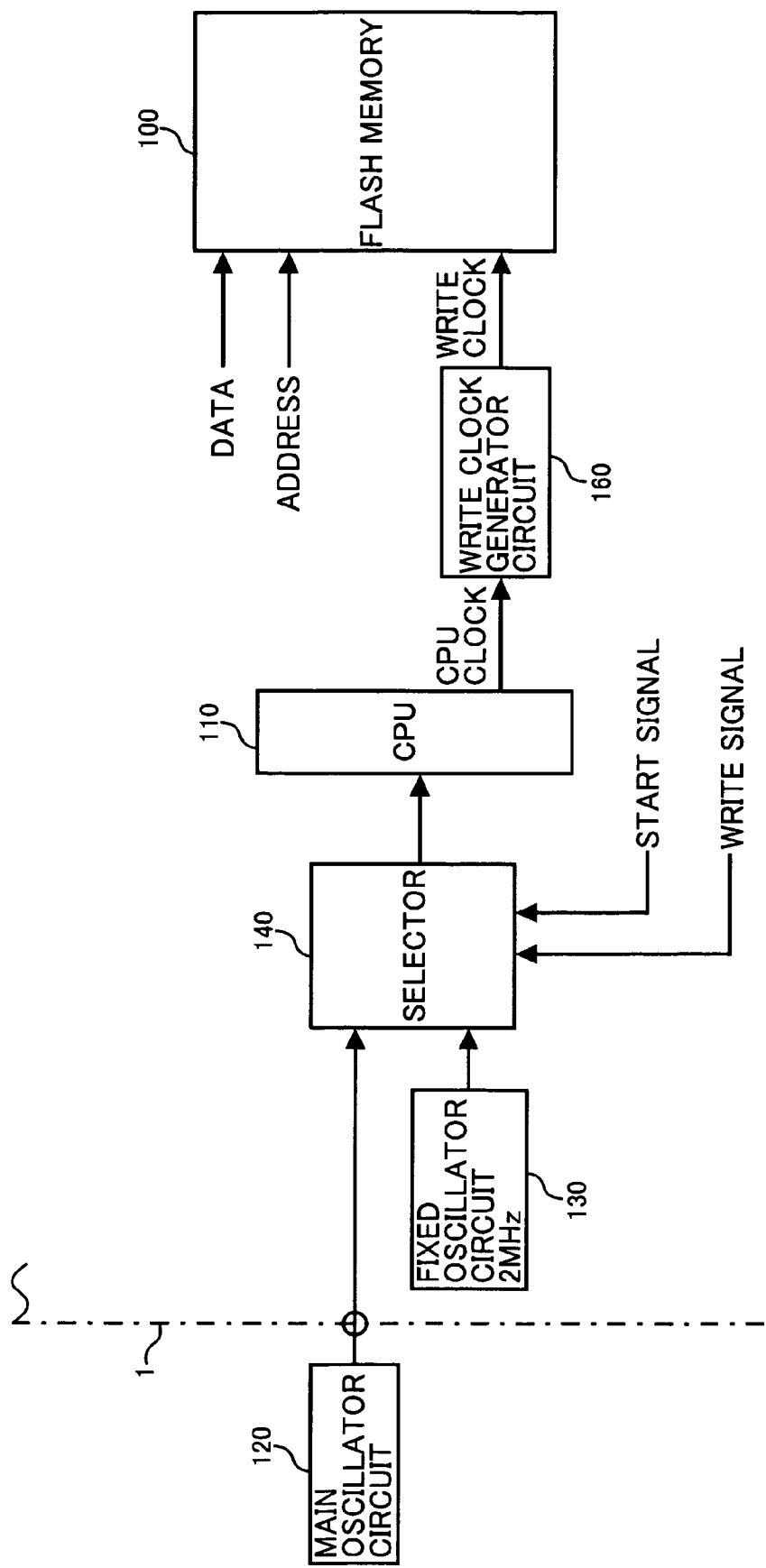
FIG. 1 is a block circuit diagram of the data write device within the microcomputer with built-in flash memory according to the first embodiment of the present invention.

The first embodiment of the present invention is described below with reference to the figures. FIG. 1 is a block circuit diagram of the data write device within the microcomputer 1 with built-in flash memory according to the present invention. In this figure, the microcomputer 1 has a flash memory 100 to which data may be written, and a CPU 110 able to control writing of data to the flash memory 100. Furthermore, it is possible to connect to the microcomputer 1 an external main oscillator circuit 120 generating a clock signal for operation of the microcomputer, in other words, for operation of the afore-mentioned CPU 110. Furthermore, the afore-mentioned microcomputer 1 has a fixed oscillator circuit 130 to start the microcomputer, and a selector 140 to select the clock signals output from the main oscillator circuit 120 and fixed oscillator circuit 130. A write clock generator circuit 160 generating the write clock used when writing data to the afore-mentioned flash memory 100 from the CPU clock signal generated by the afore-mentioned CPU 110 is also provided.

An oscillator circuit outputting clock signals of different frequencies as appropriate to the operating speed of the microcomputer designed by the user of the microcomputer 1 is selected for the afore-mentioned main oscillator circuit 120, and the selected oscillator circuit is connected externally to the microcomputer 1. This main oscillator circuit 120 is comprised of, for example, a crystal oscillator circuit obtaining a precision oscillation frequency. On the other hand, the afore-mentioned fixed oscillator circuit 130 is configured as an oscillator circuit outputting a frequency, normally a 2 MHz clock signal, necessary for starting the microcomputer. This fixed oscillator circuit 130 is, for example, configured as a simple ring oscillator circuit. The afore-mentioned selector 140 is operated with a start signal and write signal from a control circuit (not shown in figures), respective clock signals from the fixed oscillator circuit 130 selected at microcomputer start and at data write to the flash memory, and the main oscillator circuit 120 clock signal selected at other than data write following start. The selected clock signal is input to the CPU 110, and a CPU clock signal generated by software in the CPU 110. The afore-mentioned write clock generator circuit 160 generates a write clock signal with the CPU clock signal. These write clock generator circuits 160, and the CPU 110, are designed with a standard specification when configuring microcomputers, irrespective of whether the microcomputer operates at high-speed and the like.

Figure 2:
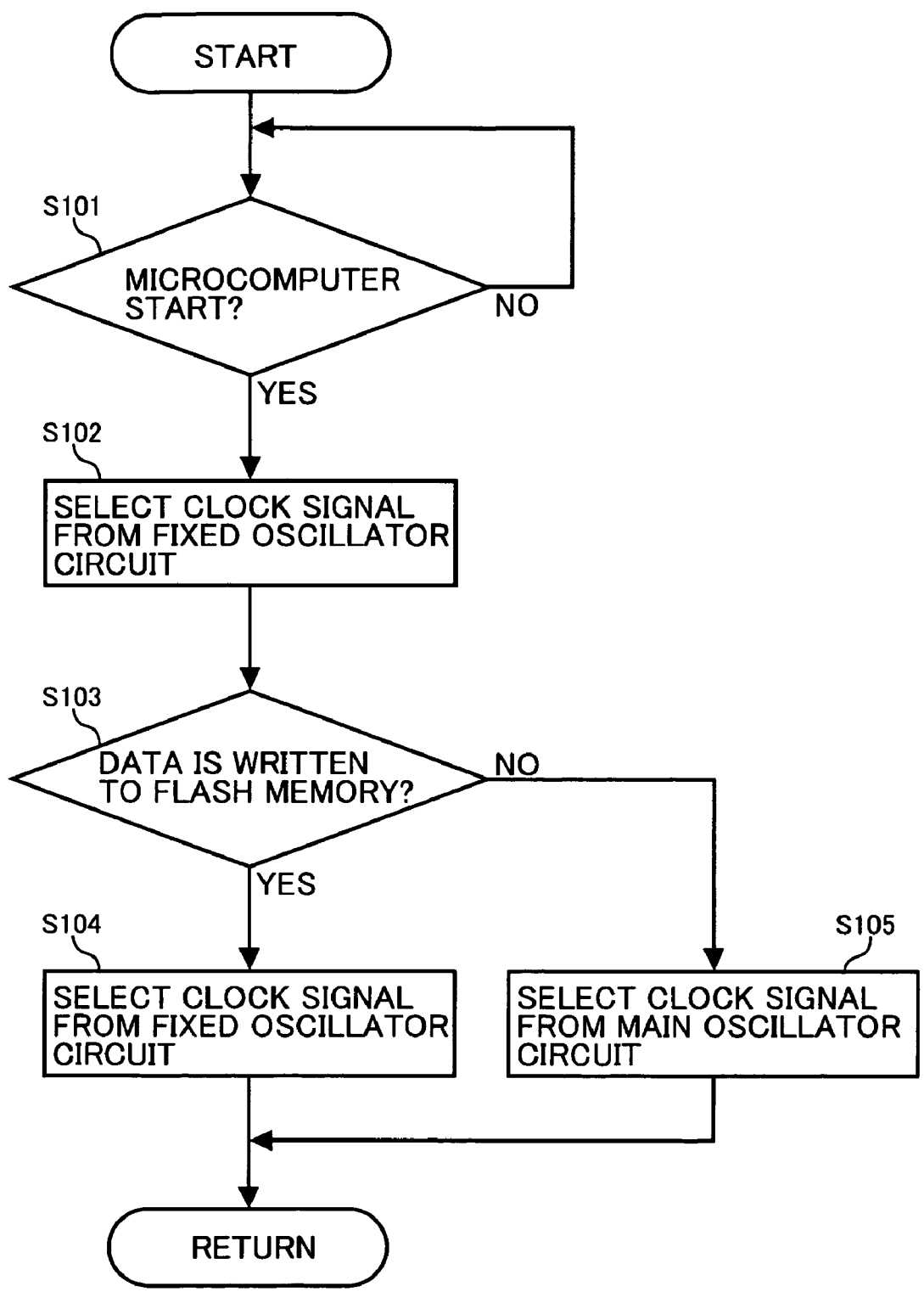
FIG. 2 is a flowchart for explaining the operation of the microcomputer according to the first embodiment of the present invention.

According to the data write device of this configuration, as shown in the flowchart in FIG. 2, the selector 140 selects the clock signal from the fixed oscillator circuit 130 at microcomputer 1 start (S101) with the start signal from the control circuit (not shown in figures), the CPU 110 is started, and the microcomputer is started (S102). Thus, even when the prescribed time is taken for stabilization of the frequency from the main oscillator circuit 120, the microcomputer 1 can be started with a fixed oscillator circuit 130 clock signal from a ring oscillator circuit having a frequency with a short rise time. When data is written to the flash memory 100 following start (S103), the selector 140 selects the clock signal output from the fixed oscillator circuit 130 with the write signal from the control circuit (not shown in figures) (S104). The selected clock signal is input to the CPU 110, and output as a software-generated CPU clock. Furthermore, this CPU clock signal is input to the write clock generator circuit 160, and a write clock generated. This write clock signal is input to the flash memory 100 together with the write data signal and the write address signal. The prescribed memory cell of the flash memory 100 is selected with these signals, and data written to the selected memory cell.

Figure 7A:
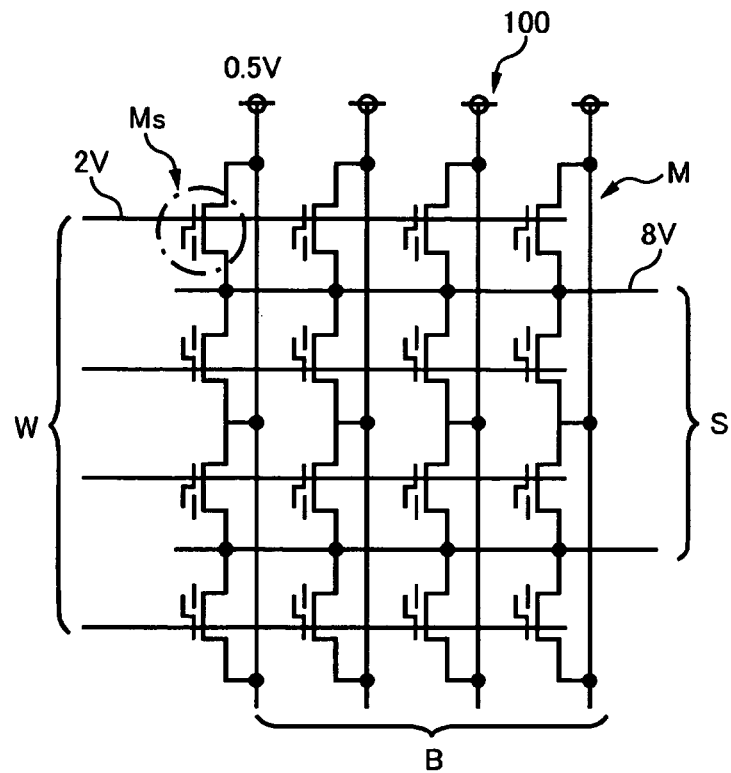
FIGS. 7A and 7B show a circuit diagram of the flash memory according to the related art.
Figure 7B:
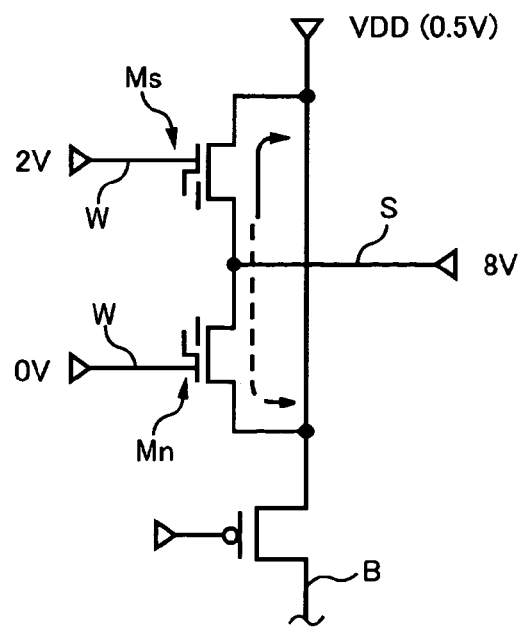
Figure 8:
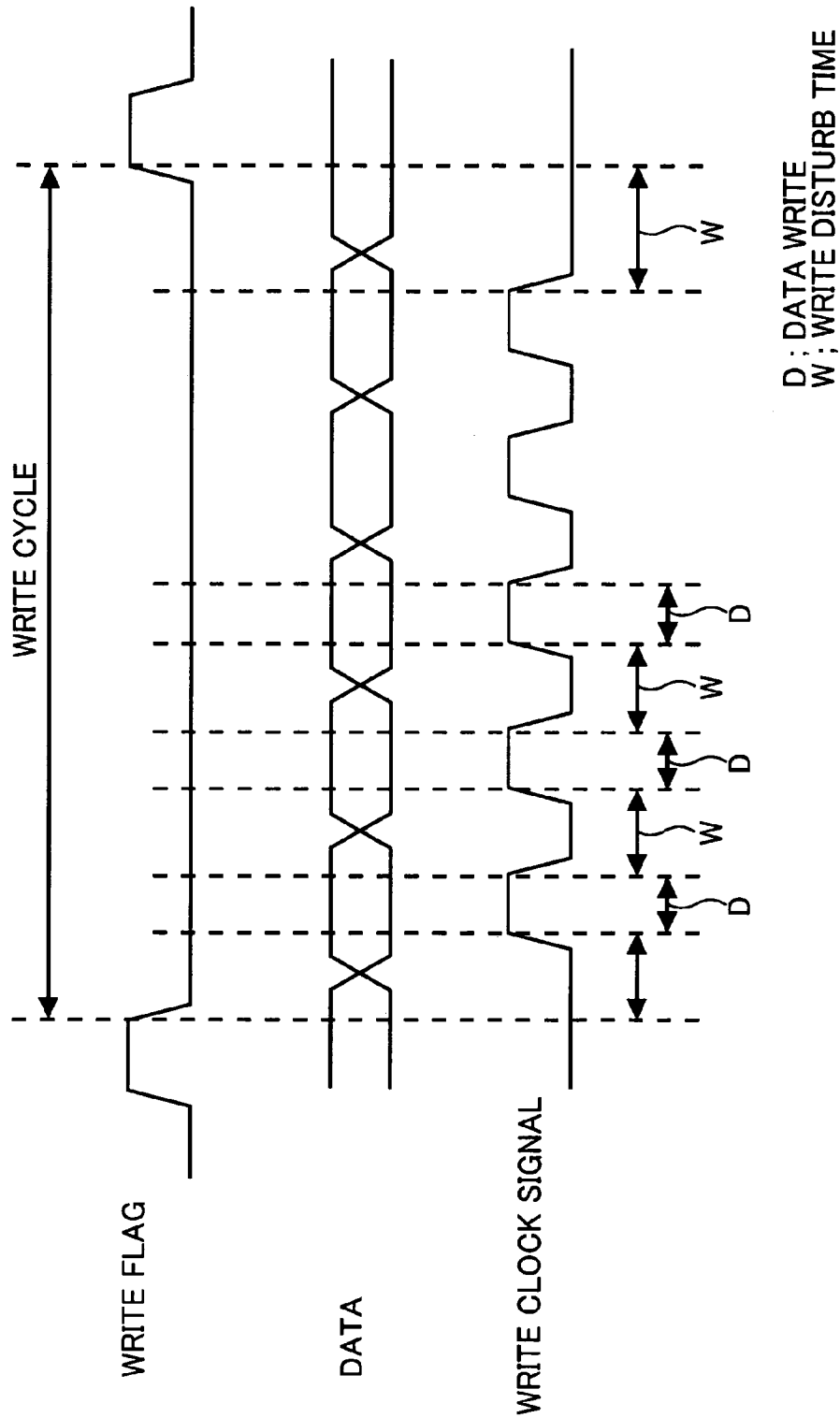
FIG. 8 is a timing chart showing the timing of data writing to the flash memory.
Figure 9:
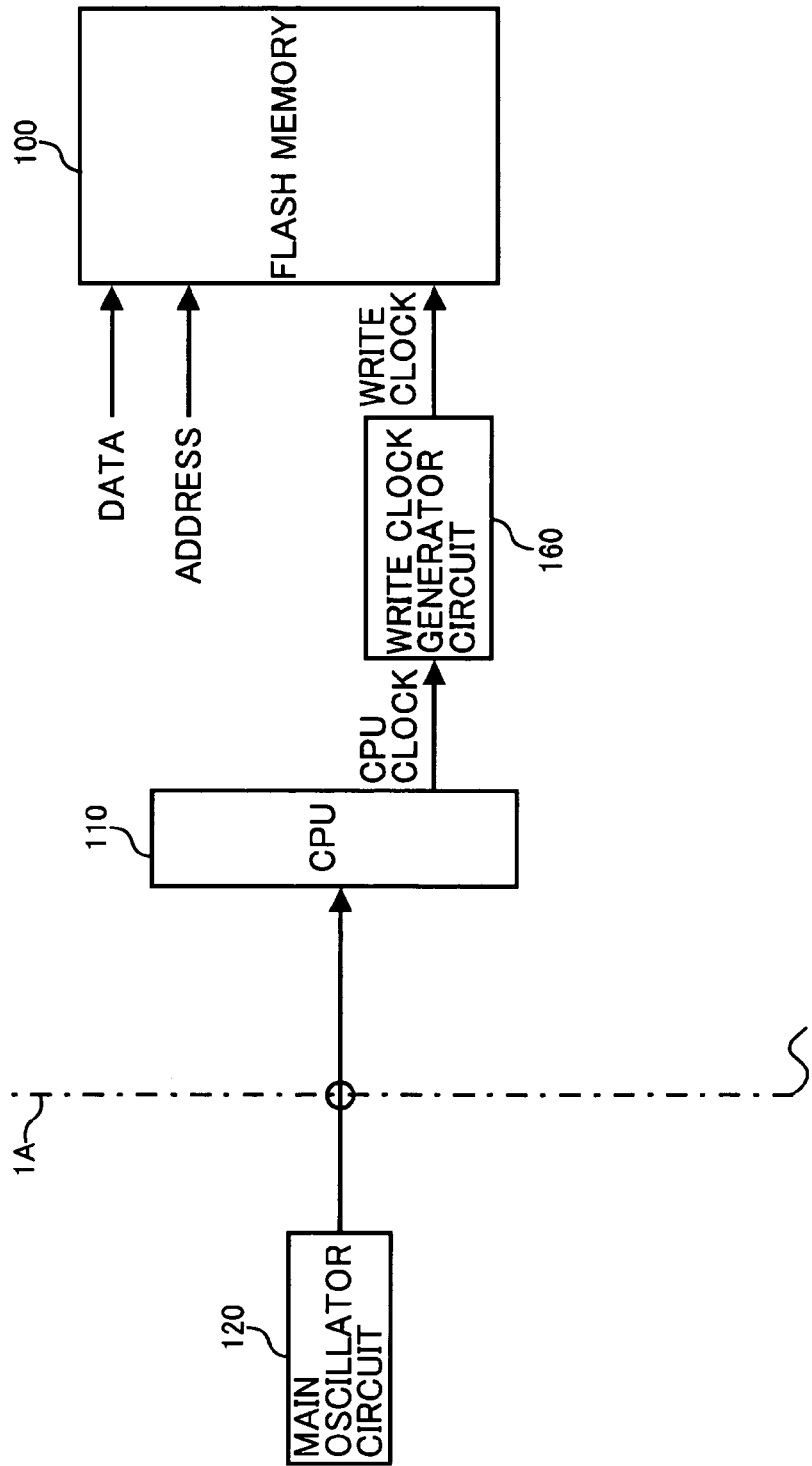
FIG. 9 is a block circuit diagram of the data write device within the microcomputer with built-in flash memory according to the related art.

Furthermore, the operation of writing data to the flash memory 100 is as shown in FIG. 7, and will be briefly described again below. After the write flag is set in the CPU, upon detecting the rising of the write clock signal, and the prescribed voltage applied to the word line of the memory cell to which the selected data is to be written. Simultaneously, the prescribed voltage is applied to the source line of the memory cell, and the bit line of the memory cell set to ON with the data. For example, as shown in 7B, the prescribed voltages are applied to the word line and bit line (for example, 2V applied to the word line, 0.5V applied to the bit line) connected to the selected memory cell to which data is to be written, and the prescribed voltage (for example, 8V) is applied to the source line connected to the memory cell. Thus, current flows from the source line to the bit line in the selected memory cell, and data is written to the memory cell. A plurality of bits of data are normally written to a plurality of memory cells with one write clock in this operation.

Since a clock signal of fixed frequency generated by the fixed oscillator circuit 130 is used as the clock signal based on the write clock signal when writing this data in the first embodiment, the write clock signal is also a clock signal of fixed frequency. As described above, the fixed oscillator circuit 130 is conventionally provided to generate the clock signal when starting the microcomputer, and all are provided with a fixed oscillator circuit according to a unified standard, irrespective of differing microcomputer users, in other words, irrespective of the use of micro computers of differing operating speeds. Thus, even with microcomputers of differing operating speeds to which differing main oscillator circuits 120 are connected, data is written to the flash memory 100 with a write clock of the same frequency.

Thus, data loss does not readily occur even when writing data to the flash memory 100 with a clock signal of the frequency output from the fixed oscillator circuit 130. In other words, a flash memory 100 having a write-disturb time in which data loss does not readily occur can be designed. Therefore, even when a user mounts a main oscillator circuit 120 of any desired frequency on the microcomputer in the first embodiment, and incorporates a microcomputer of any desired operating speed, an increase in the write-disturb time due to differing frequencies of write clock signals as in the conventional case can be prevented, and thus the excessive voltage applied to the memory cells can be reduced as much as possible, damage restricted, and a flash memory in which data loss does not readily occur can be produced.

After the microcomputer 1 is started, at times other than during data write (S103), the selector 140 selects the clock signal from the main oscillator circuit 120 (S105) using the lack of a write signal from the control circuit, the CPU clock is generated with this selected clock signal, and the microcomputer 1 is operated. Thus, the microcomputer is operated at a speed appropriate for the clock signal of the frequency generated by the main oscillator circuit 120, and by mounting a main oscillator circuit having a frequency as desired by the user, a microcomputer of the desired operating speed is obtained.

The microcomputer 1 is configured in this manner to have an internal fixed oscillator circuit 130 in which the frequency is fixed, and data is written to the flash memory 100 based on the clock signal generated by the fixed oscillator circuit 130. Simultaneously, by designing appropriately for write-disturb time when writing with the write clock obtained from the clock signal, data loss occurs less readily in the flash memory 100, writing can be achieved with the fixed-frequency write clock signal when writing data, the excessive voltage due to errors in the write-disturb time can be reduced, and data loss occurs less readily. Thus, when microcomputers of differing operating speeds in which the frequency of the main oscillator circuit 120 differs due to differences between users are incorporated, particularly when building a microcomputer of low oscillation frequency of the main oscillator circuit 120 and low operating speed, data loss can be made to occur less readily in a flash memory as described in the section on Description of the Related Art.

Second Embodiment

Figure 3:
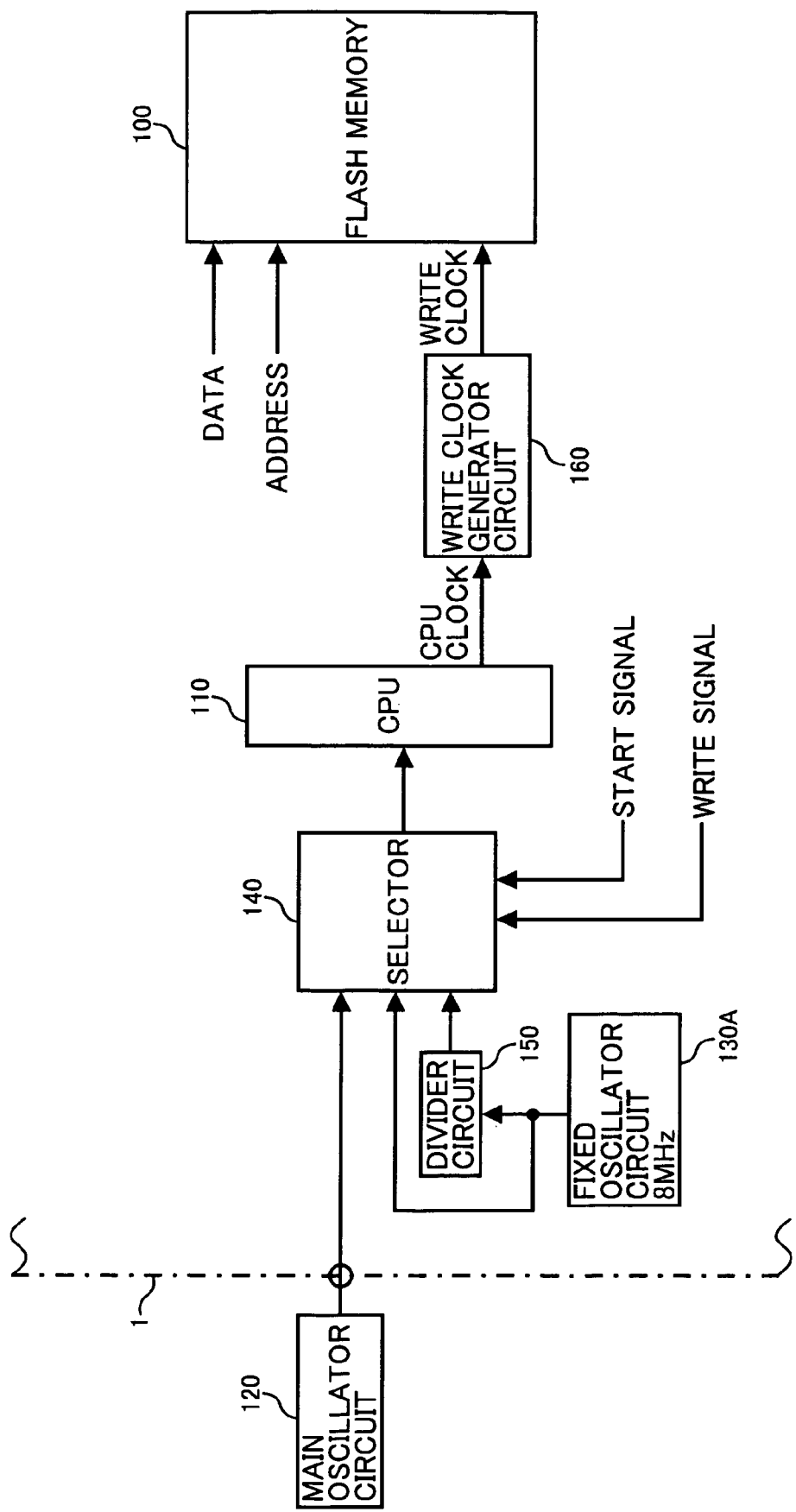
FIG. 3 is a block circuit diagram of the data write device within the microcomputer with built-in flash memory according to the second embodiment of the present invention.

Here, the existing fixed oscillator circuit of comparatively low frequency provided to generate the clock signal when starting the microcomputer is used as the fixed oscillator circuit 130 in the first embodiment, however, the configuration of the second embodiment shown in the block circuit diagram in FIG. 3 is desirable when high-speed data write is required. In the second embodiment, the fixed oscillator circuit 130A having a higher oscillation frequency than the fixed oscillator circuit 130 of the first embodiment is provided, a frequency divider circuit 150 is provided to divide the clock signal by the prescribed frequency division ratio, and the clock signal generated by the fixed oscillator circuit 130A, and the clock signal divided by the frequency divider circuit 150 are selected with the selector 140 together with the clock signal of the main oscillator circuit 120 having the external crystal oscillator connected to the microcomputer 1 as the oscillation source. Here, for example, an 8 MHz clock signal is generated from the oscillation frequency of the fixed oscillator circuit 130A, and the frequency divider circuit 150 divides this to obtain a 2 MHz clock signal.

Figure 4:
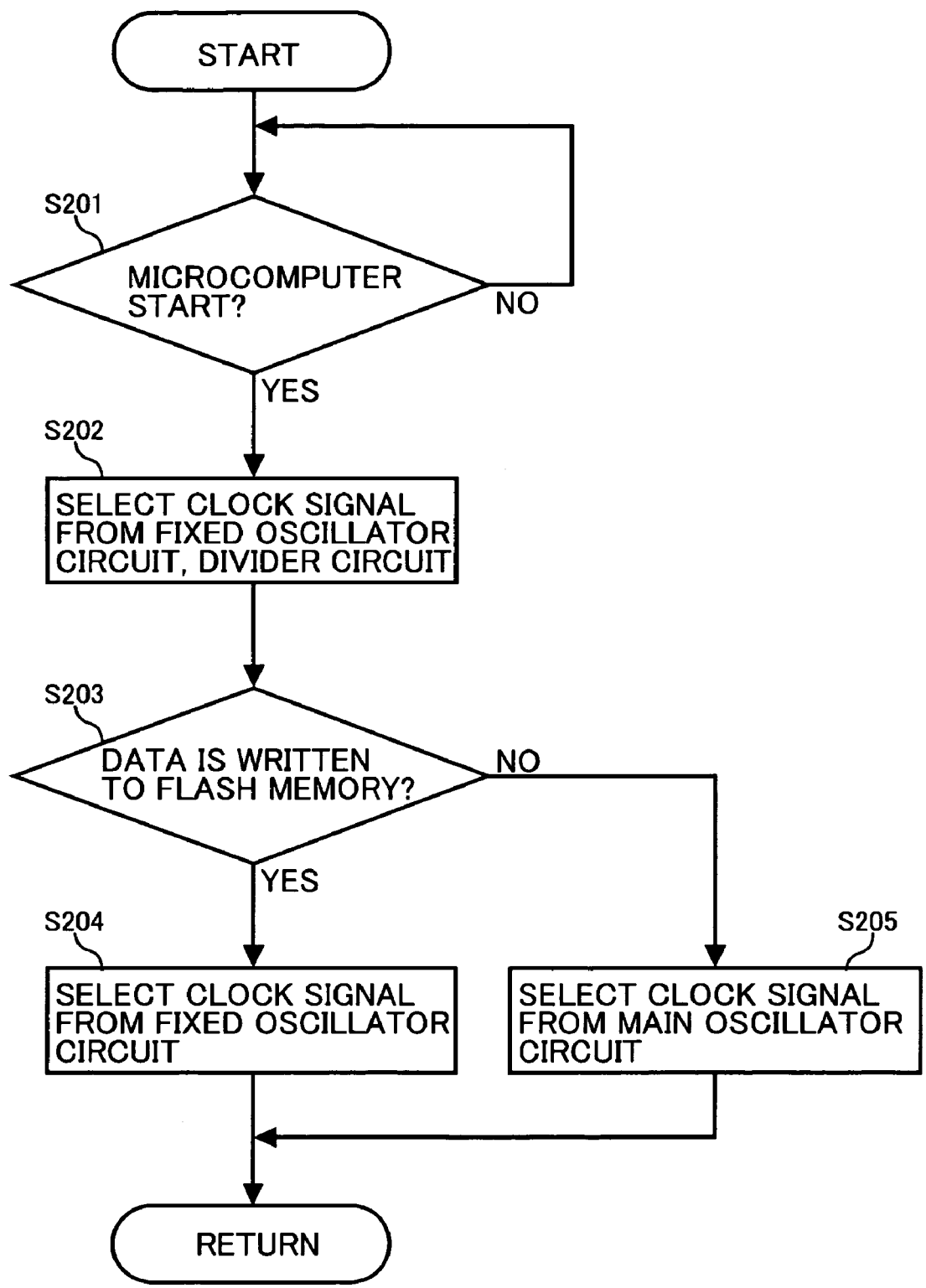
FIG. 4 is a flowchart for explaining the operation of the microcomputer according to the second embodiment of the present invention.

In the second embodiment, as shown in the flowchart in FIG. 4, when the microcomputer 1 is started (S201), the 2 MHz clock signal (obtained by dividing the clock signal of the fixed oscillator circuit 130A fixed at a high frequency with the frequency divider circuit 150) is selected (S202). Thus, even when the prescribed time is taken for stabilization of the frequency from the main oscillator circuit 120, it is possible to start the microcomputer with a clock signal of a desirable frequency obtained by dividing the clock signal of the fixed oscillator circuit 130A derived from a ring oscillator circuit having a frequency with a short rise time. When writing data (S203), an 8 MHz write clock signal is generated by directly selecting the clock signal of the fixed oscillator circuit 130A (S204), and data is written to the flash memory 100. In this case, by designing the flash memory 100 with a write-disturb time appropriate for the 8 MHz write clock signal, data can be written at a higher speed than in the first embodiment, and the write-disturb time can be appropriately reduced, the excessive voltage reduced, and data loss can be made to occur less readily. At other than data write (S203), selection of the main oscillator circuit 120 clock signal is the same as with the first embodiment (S205).

In the second embodiment, as well, when microcomputers of differing operating speeds in which the frequency of the main oscillator circuit 120 differs due to differences between users are incorporated, particularly when building a microcomputer having a main oscillator circuit 120 of low oscillation frequency and a low operating speed, data loss can be made to occur less readily when writing to the flash memory 100 by increasing the write-disturb time, and furthermore, write speed can be increased.

In both the first embodiment and second embodiment, since the fixed oscillator circuit 130 provided as standard in the microcomputer for starting, or a fixed oscillator circuit 130A having a higher frequency than the frequency of the existing fixed oscillator circuit, can be used for writing data to the flash memory 100 with the microcomputer itself, a high-speed clock signal supplied from an external source, and a new oscillator circuit, are unnecessary, permitting implementation of a low-cost microcomputer.

Third Embodiment

Figure 5:
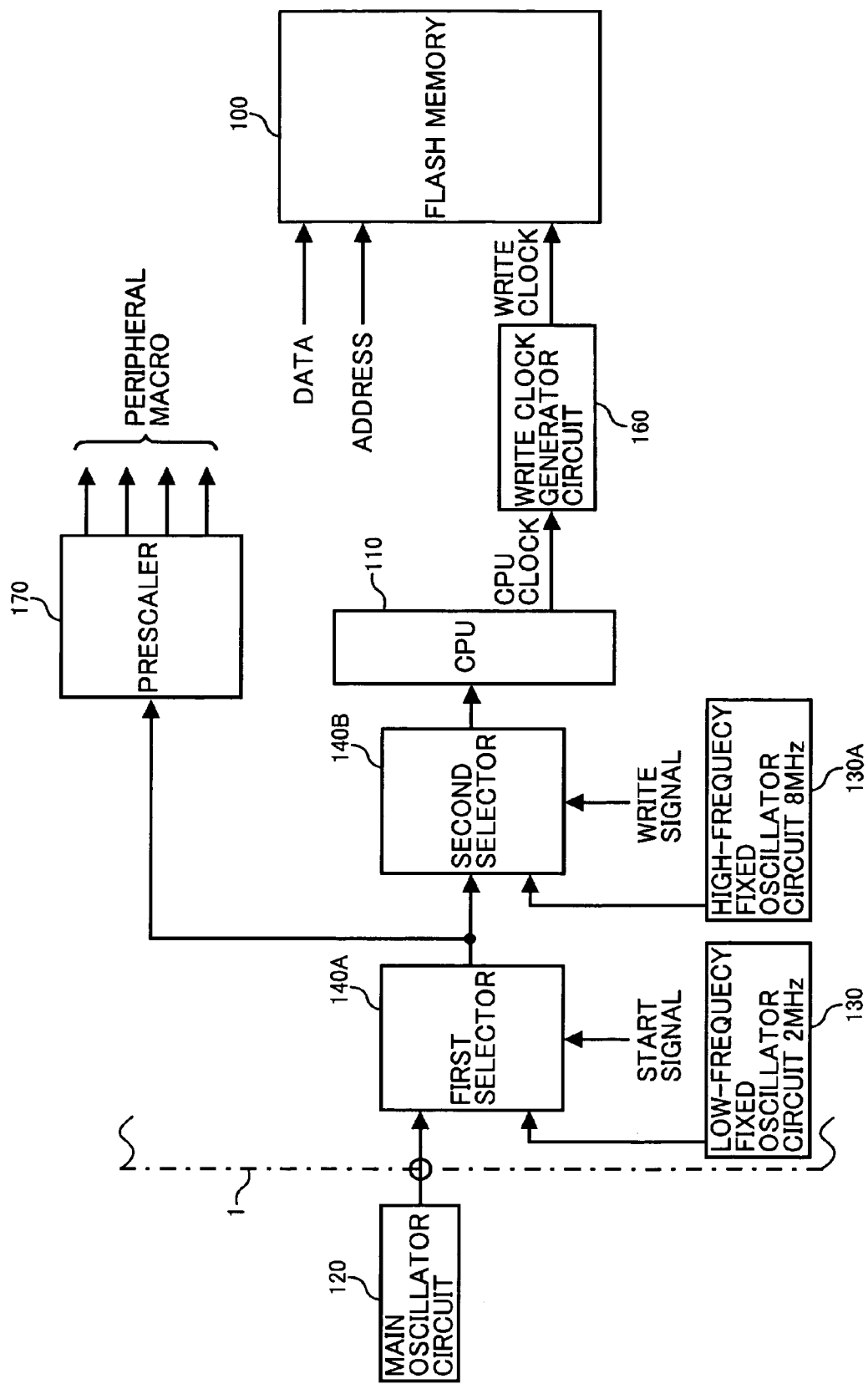
FIG. 5 is a block circuit diagram of the data write device within the microcomputer with built-in flash memory according to the third embodiment of the present invention.

FIG. 5 is a block diagram of the circuit of the third embodiment. In the third embodiment, the same fixed oscillator circuit (hereafter referred to as a 'low-frequency fixed oscillator circuit') 130 as that provided in the first embodiment, and a fixed oscillator circuit of higher oscillation frequency and similar to that of the second embodiment (hereafter referred to as a 'high-frequency fixed oscillator circuit') 130A, are provided. Here, as in the afore-mentioned first and second embodiments, the high-frequency fixed oscillator circuit 130A generating a clock signal having an 8 MHz oscillation frequency, and the low-frequency fixed oscillator circuit 130 generating a clock signal having an 2 MHz oscillation frequency, are each comprised of a ring oscillator circuit. This high-frequency fixed oscillator circuit 130A is additionally provided in the microcomputer 1, however since the existing oscillator circuit can be used, the configuration of the microcomputer 1 does not become particularly complicated. The microcomputer has a first selector 140A selecting the main oscillator circuit 120 clock signal from the crystal oscillator circuit connected externally to the microcomputer and the afore-mentioned low-frequency fixed oscillator circuit 130 clock signal, and a second selector 140B selecting the clock signal selected with the first selector 140A, and the afore-mentioned high-frequency fixed oscillator circuit 130A clock signal. Furthermore, in the third embodiment, a prescaler 170 is provided to distribute the clock signal selected with the afore-mentioned first selector 140A to a plurality of peripheral macros (not shown in drawings).

Figure 6:
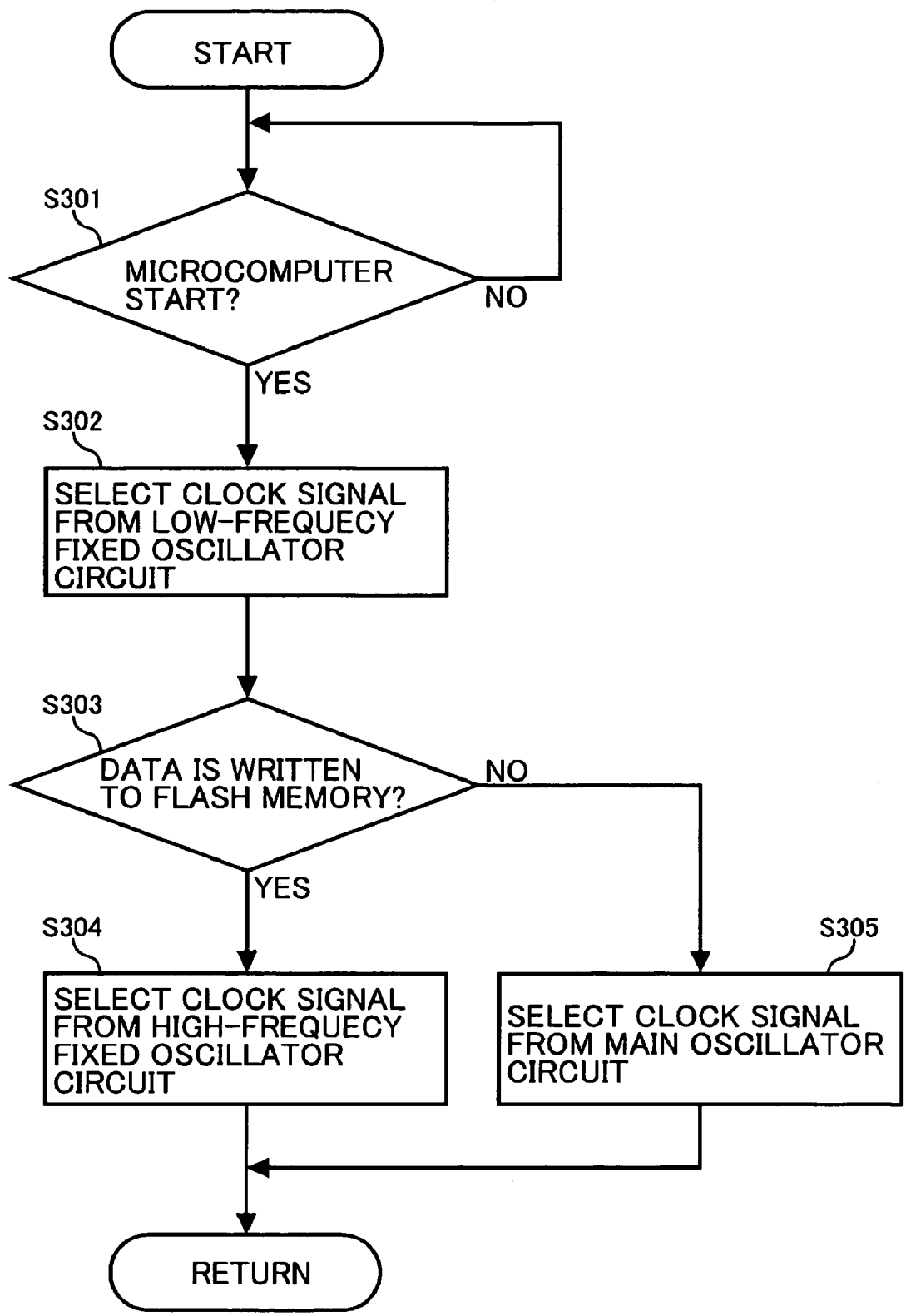
FIG. 6 is a flowchart for explaining the operation of the microcomputer according to the third embodiment of the present invention.

In the third embodiment, as shown in the flowchart in FIG. 6, when the microcomputer is started (S301), the 2 MHz clock signal from the low-frequency fixed oscillator circuit 130 is selected with the first selector 140A, and further selected with the second selector 140B, and thus the microcomputer is started with this clock signal (S302). Thus, even when the prescribed time is taken for stabilization of the oscillation frequency of the main oscillator circuit 120 the microcomputer can be started with a clock signal of the prescribed frequency from the low-frequency fixed oscillator circuit 130 supplied by the ring oscillator circuit having a frequency with a short rise time.

When writing data (S303), the 8 MHz write clock signal of the high-frequency fixed oscillator circuit 130A is selected with the second selector 140B, the write clock signal is generated, and data is written to the flash memory 100. In this case, by designing the flash memory 100 with a write-disturb time appropriate for the 8 MHz write clock signal, data can be written at high-speed as with the second embodiment, and data loss can be reliably prevented. After the microcomputer is started, at other than data write (S303), the main oscillator circuit 120 clock signal is selected with the first selector 140A. The CPU 110 is operated with the clock signal of this selected main oscillator circuit 120, or a peripheral macro operates.

In the third embodiment as well, when microcomputers of differing operating speeds in which the frequency of the main oscillator circuit 120 differs due to differences between users are incorporated, particularly when building a microcomputer of low oscillation frequency of the main oscillator circuit 120 and low operating speed, the excessive voltage is reduced due to the increased write-disturb time, and data loss can be made to occur less readily when writing data to the flash memory 100, and furthermore, increased write speed can be implemented. Particularly in the third embodiment, since the high-frequency fixed oscillator circuit 130A generating the clock signal employed when writing data to the flash memory 100 is configured as a dedicated oscillator circuit, the operating speed of the CPU 110 and peripheral macro are independent, and data can be written with a clock signal of extremely high frequency, data loss can be made to occur less readily, and high-speed data write can be implemented.

It is apparent that the present invention is not limited to the above embodiment and it may be modified and changed without departing from the scope and spirit of the invention.

What is claimed is:

1. A microcomputer with built-in flash memory to which data can be written using a write clock signal, the microcomputer comprising:

a fixed oscillator circuit which outputs a first clock signal of fixed frequency;

a clock input terminal being connectable to a main oscillator generating a second clock signal;

a selector selecting either the first clock signal or the second clock signal input from the clock input terminal and outputting a selected clock signal;

a central processing unit (CPU) receiving the selected clock signal and generating a CPU clock signal based on the selected clock signal; and a write clock generator circuit generating a write clock signal based on the CPU clock signal, wherein the selector selects the first clock signal when writing data to the flash memory.

2. The microcomputer with built-in flash memory according to claim 1, further comprising:

a divider dividing the first clock signal and outputting a divided clock signal, wherein the selector selects any from among the first clock signal, the second clock signal, and the divided clock signal.

3. The microcomputer with built-in flash memory according to claim 1, wherein the fixed oscillator circuit comprises a ring oscillator circuit.

4. The microcomputer with built-in flash memory according to claim 1, having a circuit configuration in which the flash memory is comprised of a large number of non-volatile MOS memory cell elements disposed in a matrix, adjacent pairs of memory cells connected by common bit lines and source lines, and each gate of the pair of memory cells is connected by differing word lines, wherein either memory cell is selected with the word line, and a common voltage is supplied to the common bit lines and source lines to write data.

5. An apparatus comprising the microprocessor of claim 1.

6. The microprocessor with built-in flash memory according to claim 1, wherein the flash memory is designed with a write-disturb time such that a data loss does not occur when writing data with the write clock signal of fixed frequency.

7. The microcomputer with built-in flash memory according to claim 1, wherein the selector selects the first clock signal when starting the microcomputer.

8. A microcomputer with built-in flash memory to which data can be written with a write clock signal, the computer comprising:

a first fixed oscillator circuit which outputs a first clock signal of fixed frequency;

a clock input terminal being connectable to a main oscillator generating a second clock signal;

a first selector selecting either the first clock signal or the second clock signal input from the clock input terminal and outputting a first selected clock signal;

a second fixed oscillator circuit which outputs a third clock signal affixed frequency;

a second selector selecting either the first selected clock signal or the third clock signal and outputting a second selected clock signal;

a central processing unit (CPU) receiving the second selected clock signal and generating a CPU clock signal based on the second selected clock signal; and a write clock generator circuit generating a write clock signal based on the CPU clock signal, wherein the second selector selects the third clock signal when writing data to the flash memory.

9. The microcomputer with built-in flash memory according to claim 8, wherein the first selector selects the first clock signal, and the second selector selects the first selected clock signal when starting the microcomputer.

10. The microcomputer with built-in flash memory according to claim 8, wherein a frequency of the second oscillator is higher than that of the first oscillator.

11. The microcomputer with built-in flash memory according to claim 8, further comprising:

a prescaler distributing the first selected clock signal to a plurality of peripheral macros.

* * * * *